United States Patent
Komaili et al.

(10) Patent No.: US 6,476,677 B1
(45) Date of Patent: Nov. 5, 2002

(54) POWER AMPLIFIER SATURATION DETECTION AND COMPENSATION

(75) Inventors: Jaleh Komaili, Irvine, CA (US); Ricke W. Clark, Irvine, CA (US)

(73) Assignee: Skyworks Solutions, Inc., Newport Beach, CA (US)

( * ) Notice: Subject to any disclaimer, the term of this patent is extended or adjusted under 35 U.S.C. 154(b) by 32 days.

(21) Appl. No.: 09/651,801

(22) Filed: Aug. 30, 2000

(51) Int. Cl.⁷ .................................................. H03G 3/30
(52) U.S. Cl. ........................................ 330/279; 330/281
(58) Field of Search ................................ 330/129, 141, 330/278, 279, 280, 281

(56) References Cited

U.S. PATENT DOCUMENTS 4,945,314 A * 7/1990 Van Den Bungelaar ..... 330/279 X
5,278,994 A * 1/1994 Black et al. ............ 330/278 X

* cited by examiner

*Primary Examiner*—Steven J. Mottola
(74) *Attorney, Agent, or Firm*—Howrey Simon Arnold & White, LLP

(57) ABSTRACT

A system for detecting and compensating for a saturation condition of a power amplifier where an error signal is produced by differencing a signal representative of or derived from a control signal for controlling the shape of the output of the power amplifier and a signal representative of or derived from the output of the power amplifier. An integrator integrates the error signal to produce a cumulative error signal. A detection circuit detects a saturation condition when the value of the cumulative error equals or exceeds a predetermined value determined during device calibration. Upon the detection of a saturation condition, a compensation circuit derives a compensation value by multiplying the value of the error signal at the time saturation is detected by a predetermined constant, and subtracts this value from the control signal. The input to the power amplifier is derived from the adjusted control signal.

32 Claims, 7 Drawing Sheets

POWER AMPLIFIER SATURATION DETECTION AND COMPENSATION

BACKGROUND OF THE INVENTION

1. Field of the Invention.

This invention generally relates to power amplifier (PAs), and more specifically, to detecting and compensating for saturation of power in PAs.

2. Related Art.

In GSM-compliant or TDMA-compliant mobile devices, such as wireless handsets, the transmitter needs to power up and down within a predetermined power vs. time mask having predetermined noise characteristics. At the same time, in order to increase battery life and hence talk time, the device should be operated at maximum or near-maximum efficiency. These objectives are difficult to achieve if the power amplifier in the transmitter or transceiver becomes saturated.

Conventional techniques for saturation compensation are open loop techniques in which, upon the detection of a saturation condition, the amplifier is backed off by a predetermined amount. Depending on the degree to which the amplifier has entered the saturation mode, the predetermined amount may be insufficient to bring the amplifier out of saturation, or may back the amplifier off by an amount which is greater than that necessary to exit the saturation mode. Thus, with the conventional techniques, there is a risk that the amplifier will not be operated at maximum or near-maximum efficiency.

SUMMARY

This invention provides a system for detecting and compensating for a saturation condition in a power amplifier. The system may include in series a saturation compensation circuit, a comparator, an integrator, and a saturation detection circuit. The saturation compensation circuit receives a control signal for controlling the shape of the output of the power amplifier, and adjusts that signal when a saturation condition is detected by the saturation detection circuit. The comparator compares the output of the saturation compensation circuit with the output of the power amplifier and produces an error signal representative of the difference between the two. The integrator integrates the error signal to produce a cumulative error signal. The saturation detection circuit detects a saturation condition responsive to the integrated error signal, and signals the saturation compensation circuit when a saturation condition has been detected. Responsive to the detection of a saturation condition, the saturation compensation circuit adjusts the control signal by a compensation value that is derived from the value of the error signal at the time the saturation condition is detected. In one implementation, the compensation value may be equal to the instantaneous error at the time saturation is detected multiplied by a predetermined constant. In another implementation, this compensation value may be the average error at the time saturation is detected multiplied by a predetermined constant. A signal derived from the output of the adjusted control signal forms the input to the power amplifier. In one implementation, the input to the power amplifier is derived from the output of the integrator.

In another implementation, a saturation condition may be detected when the cumulative error output from the integrator equals or exceeds a predetermined value, INTEG_MAX, determined during device calibration. In response, the saturation detection circuit sets a flag to 1. When the value is set to 1, the saturation compensation circuit latches a compensation value equal to the instantaneous error output from the comparator by a predetermined calibration constant. The saturation compensation circuit subtracts this value from the signal representing the desired output of the power amplifier.

A method for detecting a saturation condition of a power amplifier is also disclosed. A signal derived from or representative of a control signal for controlling the shape of the output of the power amplifier is compared to a signal representative of or derived from the actual output of the power amplifier, and the two are differenced to form an error signal. The error signal is then integrated to form a cumulative error signal. The saturation condition is detected if the cumulative error signal equals or exceeds a predetermined value.

Another method of the invention includes compensating for the saturation condition of a power amplifier. When a saturation condition is detected, a signal representative of or derived from a control signal for controlling the shape of the output of the power amplifier is compared to a signal representative of or derived from the actual output of the power amplifier, and the two are subtracted to form an error signal. A compensation value is derived from the error signal and is subtracted from the control signal. The input to the power amplifier is derived from this adjusted signal.

The compensation value may be determined by multiplying the instantaneous error, at the time saturation is detected, by a predetermined constant. In another implementation, the compensation value may be determined by multiplying the average error signal, at the time saturation is detected, by a predetermined constant.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numbers designate corresponding parts throughout the different views.

DETAILED DESCRIPTION

Figure 1:
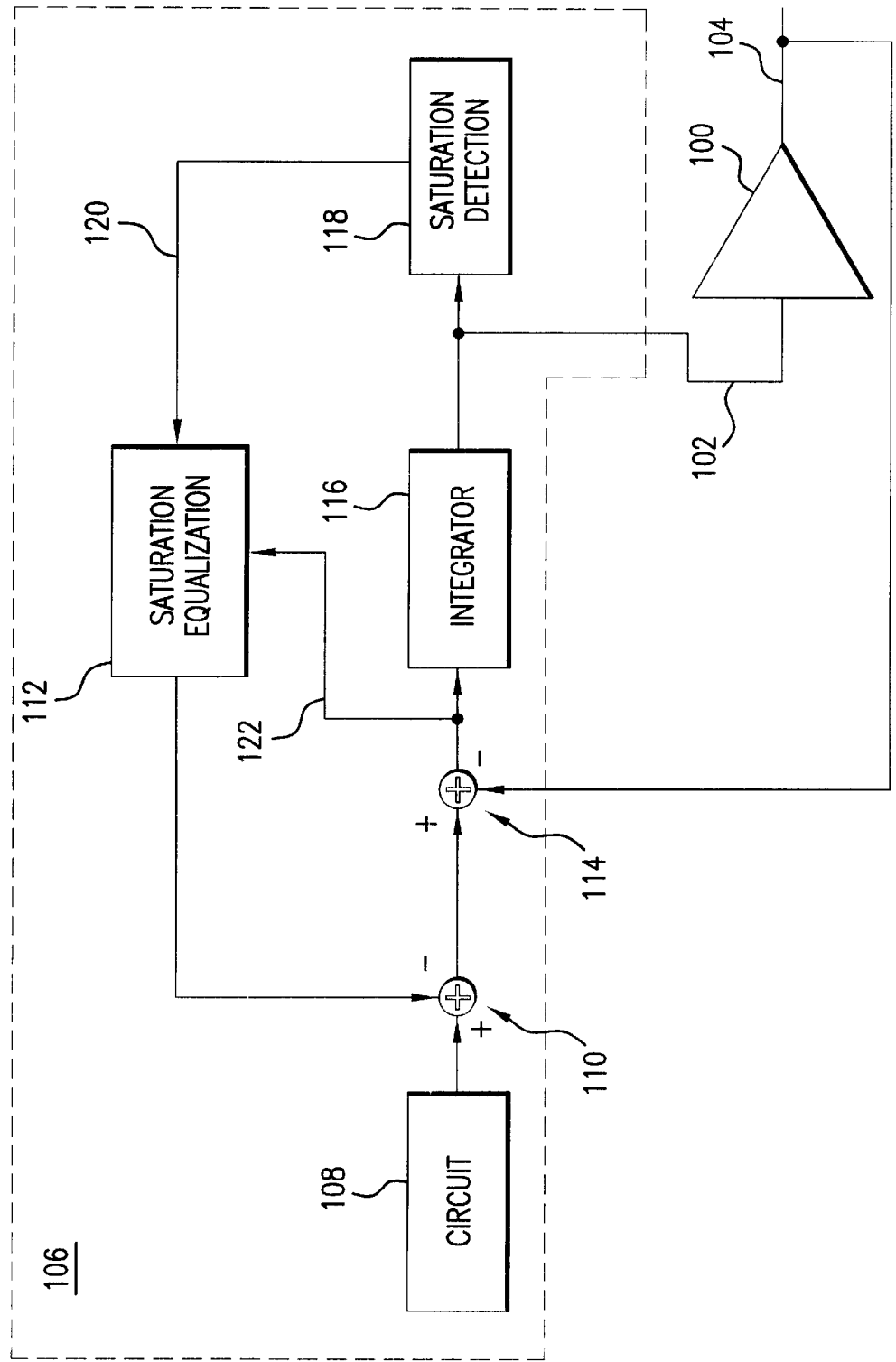
FIG. 1 is a block diagram illustrating one power amplifier saturation detection and compensation system.

FIG. 1 is a block diagram illustrating a system having a power amplifier 100 with an input 102, and an output 104. The input helps determine the shape of the signal provided at the output 104. Circuitry 106 is also provided for detecting a saturation condition of the power amplifier 100, and then manipulating the input 102 of the power amplifier to compensate at least in part for the saturation condition.

The circuitry 106 may include a circuit 108 for providing a signal for controlling the shape of the output 104 of the power amplifier 100. The output of the circuit 108 is input to a summer 110, which subtracts from this signal the output of saturation equalization circuit 112. Summer 110 may be part of saturation equalization circuit 112 or may be separate. A signal derived from the output of summer 110 is input to comparator 114. In addition, a signal derived from the output 104 of the power amplifier is also input to the comparator. Comparator 114 produces an error signal representing the difference between the two signals.

This error signal is input to integrator 116 to provide a cumulative error signal. The cumulative error output from integrator 116 is provided to saturation detection circuit 118. From this cumulative error signal, saturation detection circuit 118 detects whether or not the power amplifier 100 has entered a saturation condition. A signal representative of the cumulative error signal is provided to saturation equalization circuit 112 over signal line 120.

A signal derived from integrator 116 forms the input 102 to the power amplifier. Upon the occurrence of a saturation condition, saturation equalization circuit 112 determines a compensation value responsive to the error signal provided over signal line 122. The value is then subtracted by summer 110 from the signal provided by circuit 108. This adjustment is ultimately reflected in the input to the power amplifier. Accordingly, amplifier 100 is prevented from entering saturation, or if it has entered saturation, is brought out of saturation after only a very short time.

The system is a closed loop system where the output of the power amplifier at about the time saturation is detected is used to determine the compensation value for adjusting the input of the power amplifier. Thus, the system is more robust compared to conventional open loop techniques. Moreover, since the system uses the cumulative error output from the integrator in detecting whether a saturation condition is present, it is more accurate in detecting a saturation condition that conventional approaches.

Figure 2:
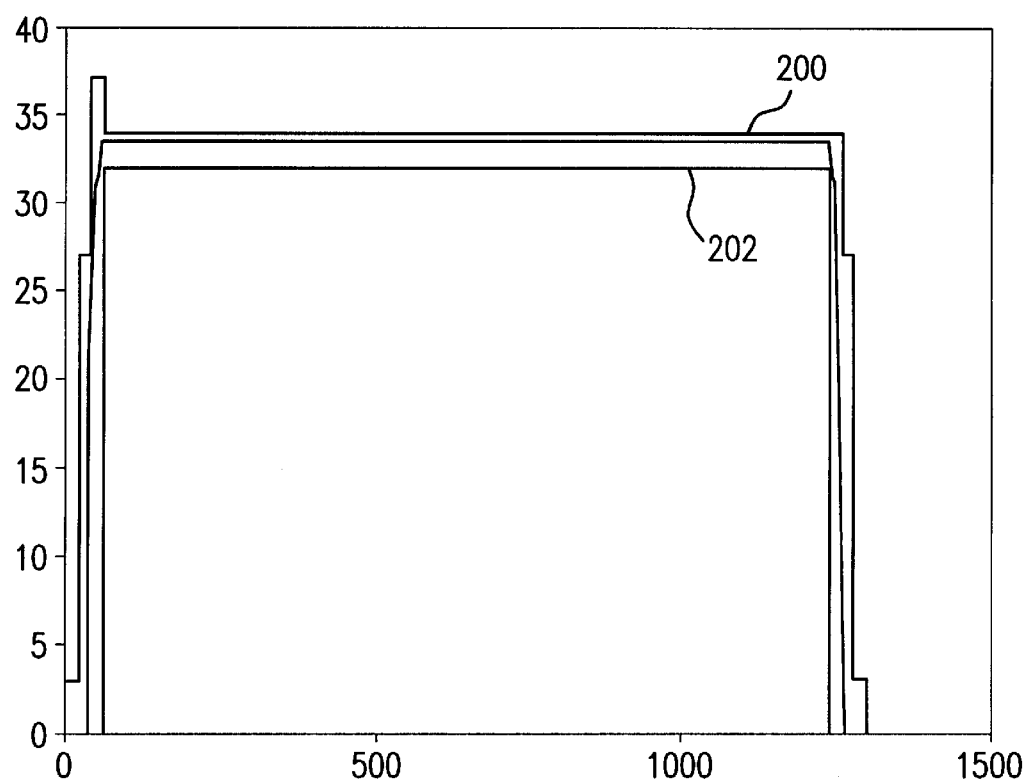
FIG. 2 is a graph illustrating a predetermined power vs. time mask for the output of a power amplifier in a GSM-compliant transmitter.

FIG. 2 illustrates an example of an output signal profile bounded by pre-specified power vs. time masks. One of the masks 200 provides an upper bound for the output of the power amplifier. The other mask 202 provides a lower bound for the power amplifier.

Figure 3:
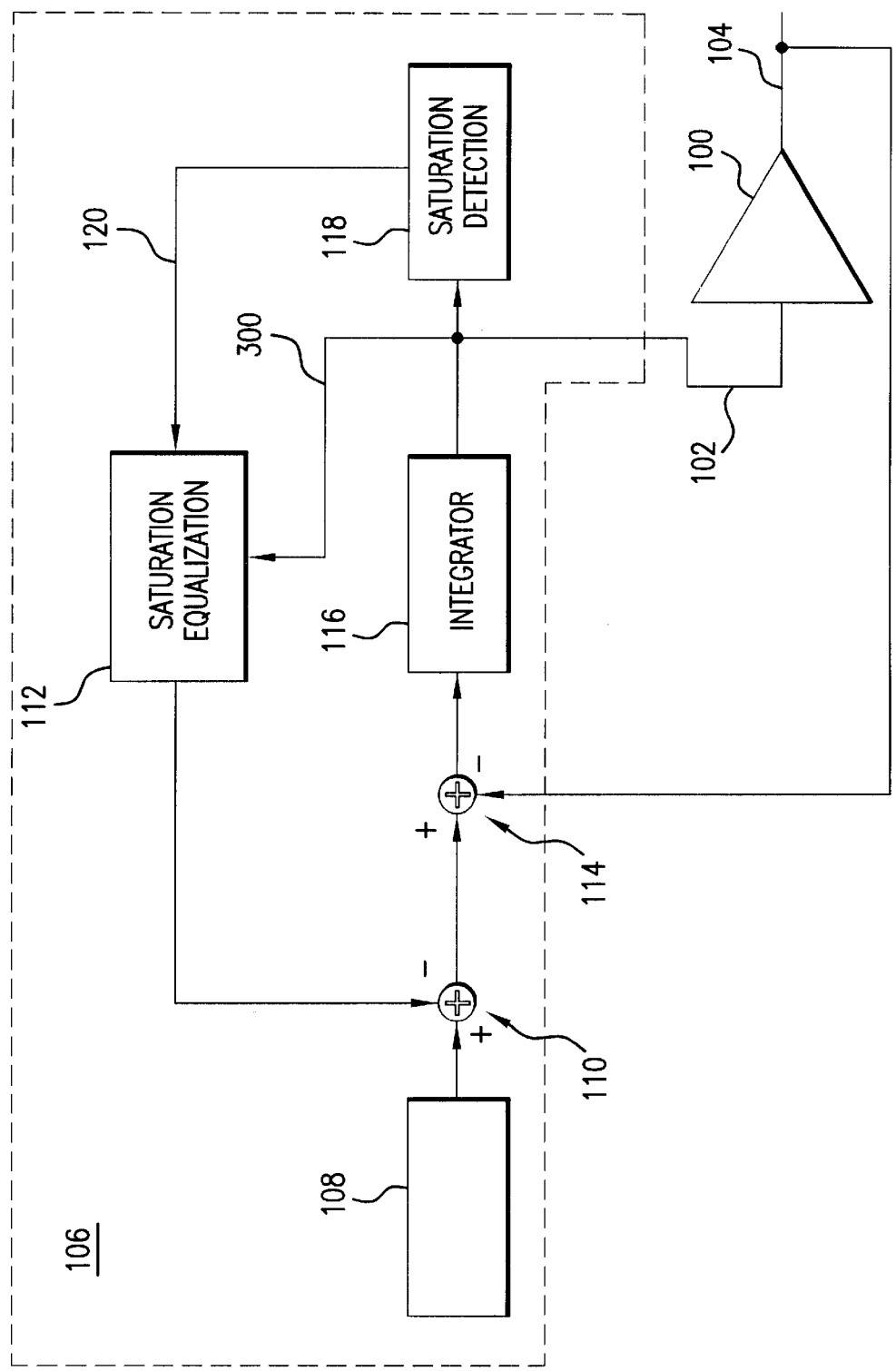
FIG. 3 is a block diagram illustrating another embodiment of a power amplifier saturation detection and compensation system.

A second embodiment of a system is illustrated in FIG. 3. The difference between the two embodiments represented in FIGS. 1 and 3 is that in FIG. 3, the saturation equalization circuit 112, upon the detection of a saturation condition, determines a compensation value for saturation equalization responsive to the average cumulative error rather than the instantaneous error. This is why saturation equalization circuit 112 receives an input from integrator 116 (over signal line 300) rather than from comparator 114.

Figure 4:
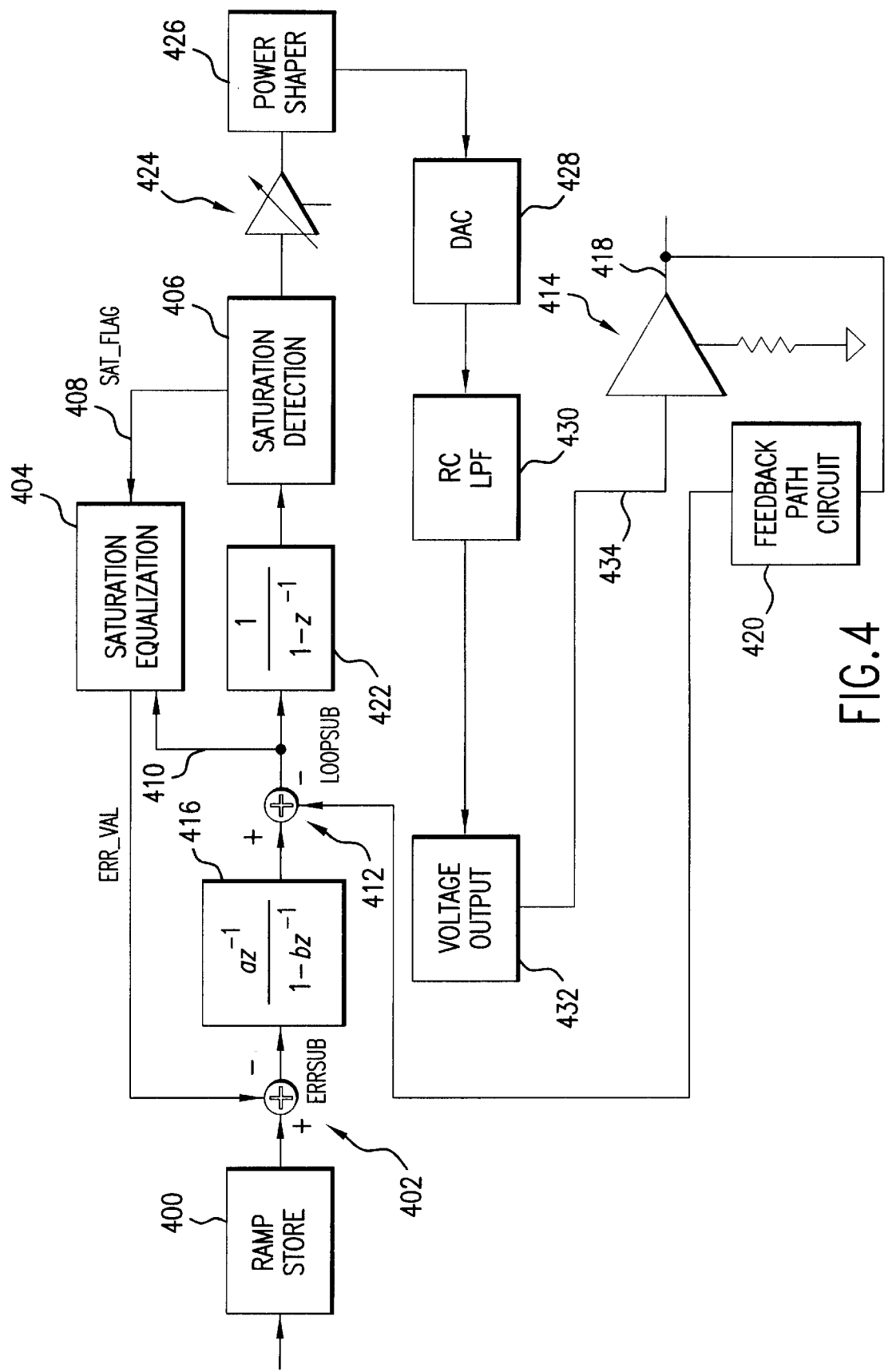
FIG. 4 is a block diagram illustrating one implementation scheme of a power amplifier saturation detection and compensation system.

An implementation of the embodiment of FIG. 1 is illustrated in FIG. 4. Ramp store 400 provides the reference input that enables the system to produce an output signal profile bounded by pre-specified power vs. time masks defined by a standards body such as ETSI (see FIG. 2 for an example). The output of ramp store 400 is provided to summer 402 which subtracts the output, err_val, of saturation equalization circuit 404. Saturation equalization circuit 404 includes a latch (not shown) which provides the output, err_val. Saturation equalization circuit 404 updates the contents of the latch responsive to the output of saturation detection circuit 406 provided over signal line 408. The output of saturation detection circuit 406 is a flag, sat_flag, which is a 1 if a saturation condition is present, and is a 0 otherwise. In the case in which sat_flag is 1, the contents of the latch is set equal to a constant SAT_CAL multiplied by the value of the instantaneous error signal, loopsub, provided over signal line 410 from the output of comparator 412.

In one implementation example, SAT_CAL is set at 1.0, but it should be appreciated that values less than 1.0, and greater than 1.0 are possible. In the case in which sat_flag is 0, the contents of the latch are not updated, but are kept equal to the value of err_val that was determined and latched during the most previous saturation condition. Thus, it can be seen that in this implementation, saturation equalization circuit 404 sets err_val to a value equal to the constant SAT_CAL multiplied by the instantaneous error signal output from summer 412 when the power amplifier 414 is in saturation, and it maintains the previous value of err_val in the case where the power amplifier 414 is not in saturation. In other words, a value for err_val is subtracted from the output of ramp store 400 even when a saturation condition is not present. However, it should be appreciated that implementations are possible where the saturation equalization circuit 404 provides an output that is subtracted from the output of ramp store 400 only when a saturation condition is present or imminent.

The output of summer 402, errsub, is provided as an input to low pass filter (LPF) 416 having the transfer function $$\frac{az^{-1}}{1-bz^{-1}}.$$

The output of LPF 416 is provided as an input to comparator 412. In addition, the output 418 of power amplifier 414 is fed into a feedback path circuit 420 which in turn adjusts the gain and dynamic range of the signal and digitizes it. The output of feedback path circuit 420 forms a second input to comparator 412.

Comparator 412 subtracts this signal from the output of LPF 416 The result is an error signal, loopsub, representative of the instantaneous error or difference between the control signal output from ramp store 1 and the output of power amplifier 414. As previously stated, this error signal is provided as an input to saturation equalization circuit 404 over signal line 410. In addition, it is provided as an input to integrator 422 which, as illustrated, has the transfer function $$\frac{1}{1-z^{-1}}.$$

The output of integrator 116 is a cumulative error signal representing the accumulation over time of the errors reflected in the error signal loopsub.

The output of integrator 422 is provided as an input to saturation detection circuit 406 which determines whether a saturation condition is present or imminent responsive to the accumulated error signal provided from integrator 422. In one implementation example, saturation detection circuit 406 functions by comparing the accumulated error signal with a value, INTEG_MAX, determined during device calibration. If the accumulated error exceeds INTEG_MAX, a saturation condition is assumed to be present; if not, it is assumed not present. If a saturation condition is present, sat_flag, is set to 1. If not, the flag is reset to 0.

The accumulated error signal from integrator 422 is also passed through saturation detection circuit 406 to amplifier 424. Amplifier 424 functions as the DAC gain. The output of amplifier 424 is provided to power shaper 426. Power shaper 426 provides a programmable gain shaping function to the forward path of the PAC loop. The output of power shaper 426 is input to digital-to-analog converter (DAC) 428. DAC 428 converts the incoming signal to analog, and the analog signal is provided as an input to RC LPF 430. RC LPF 430 smooths the analog signal. The output of RCLPF 430 is provided as an input to voltage output circuit 432. Voltage output circuit 432 functions to convert the incoming signal to a voltage mode signal. The voltage mode signal is then provided as an input to the input 434 of power amplifier 414.

Figure 5:
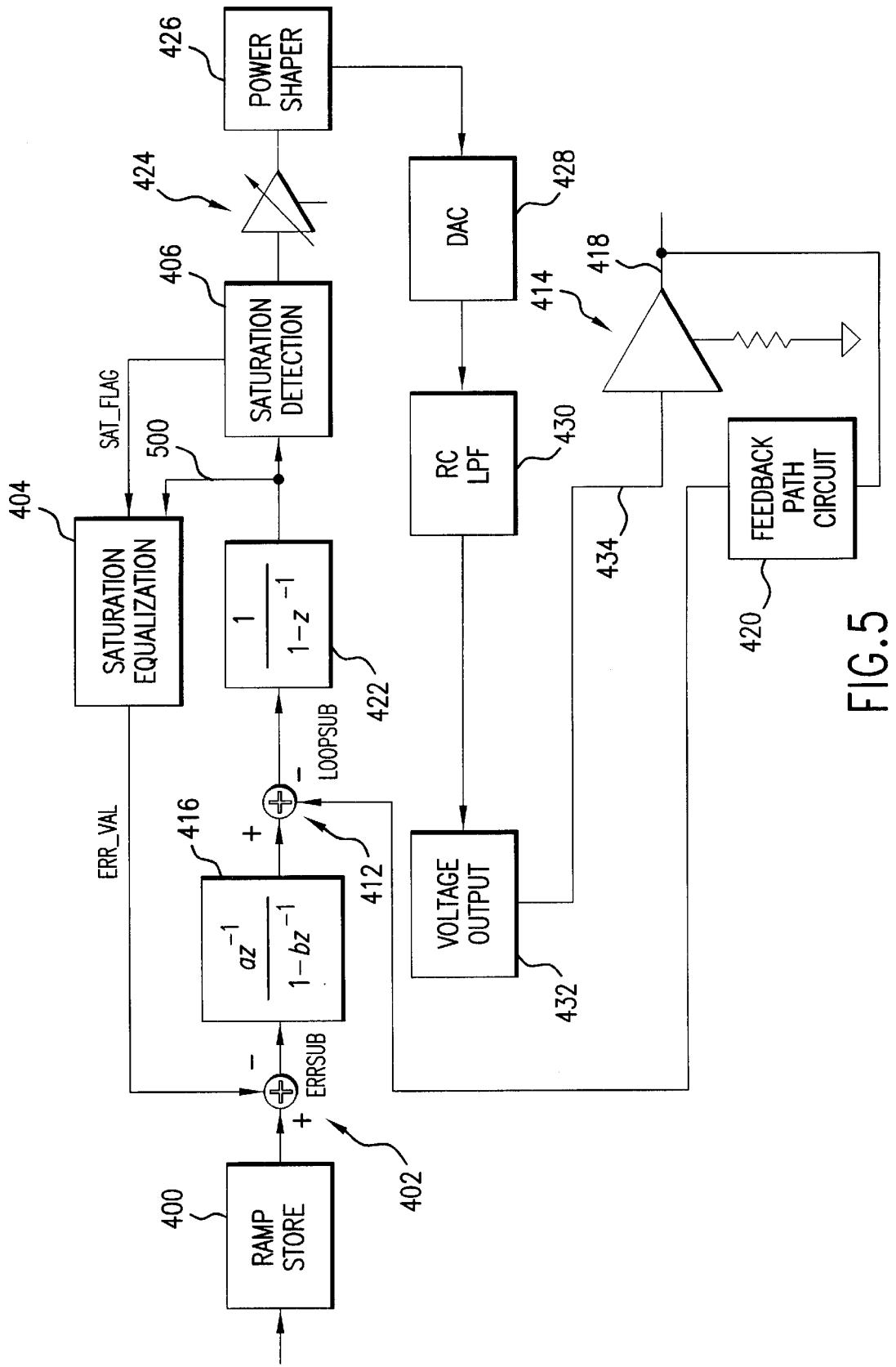
FIG. 5 is a block diagram illustrating another implementation of a power amplifier saturation detection and compensation system.

An implementation of the embodiment of FIG. 3 is illustrated in FIG. 5. This implementation is identical to the implementation of FIG. 4 except that the cumulative error from integrator 422 is provided over signal line 500 as an input to saturation equalization circuit 404 in lieu of the instantaneous error output from summer 412. This instantaneous error signal is provided over signal line 410 to saturation equalization circuit 404 in the implementation of FIG. 4.

In this implementation, saturation equalization circuit 404 divides the cumulative error by the duration of time over which the error was accumulated. The result is an average cumulative error. In the case in which a saturation condition is present, the saturation equalization circuit 404 latches the product of the constant SAT_CAL with the average cumulative error. In the case in which a saturation condition is not present, the saturation equalization circuit 404 does not update the latch. In this case, the latch thus retains the value that was stored in it during the previous saturation condition. The output of the latch is the value err_val which is provided to summer 402. Otherwise, this implementation is the same as that illustrated in FIG. 4. Consequently, no further explanation is needed.

Figure 6:
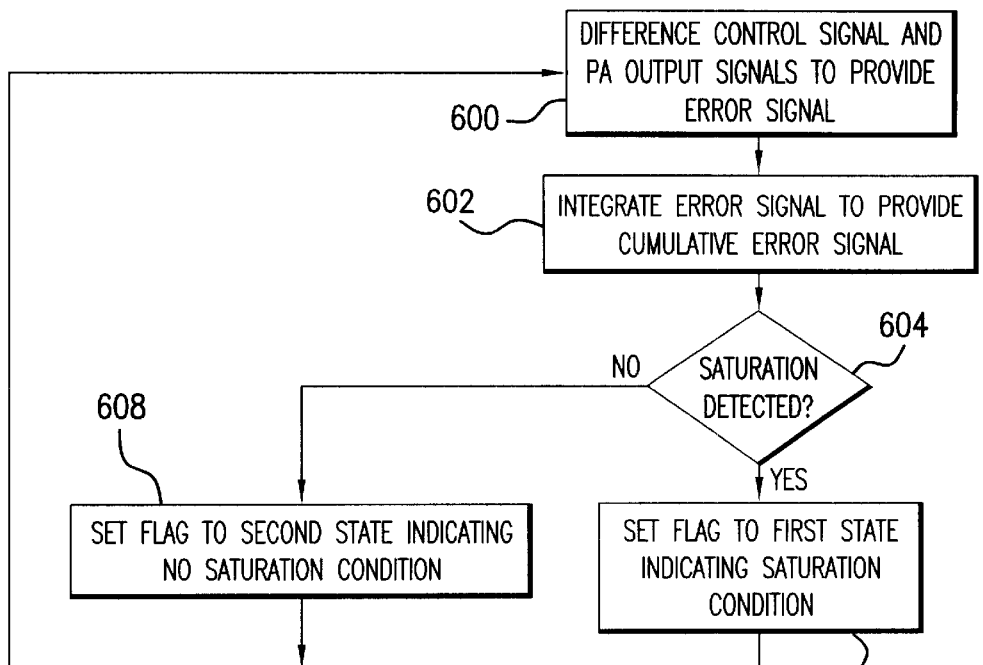
FIG. 6 is a flowchart illustrating a method of detecting for a saturation condition of a power amplifier.

FIG. 6 illustrates an embodiment of a method of saturation detection. As illustrated, in step 600, a signal representative of or derived from a control signal for controlling the shape of the output of the power amplifier and a signal representative of or derived from the actual output of the power amplifier are differenced to produce an error signal. In step 602, the error signal is integrated to produce a cumulative error signal. In step 604, the cumulative error signal is analyzed to determine if a saturation condition is present. In one implementation, this step occurs by comparing the cumulative error with a predetermined constant determined during device calibration. If the cumulative error exceeds the predetermined constant, a saturation condition is assumed to be present. Otherwise, a saturation condition is assumed to be absent. If a saturation condition is present, step 606 is performed; otherwise, step 608 is performed. In step 606, a flag is placed in a first state, indicating that a saturation condition is present. In step 608, the flag is placed in a second state, indicating that a saturation condition is not present. The process then repeats itself beginning with step 600.

Figure 7:
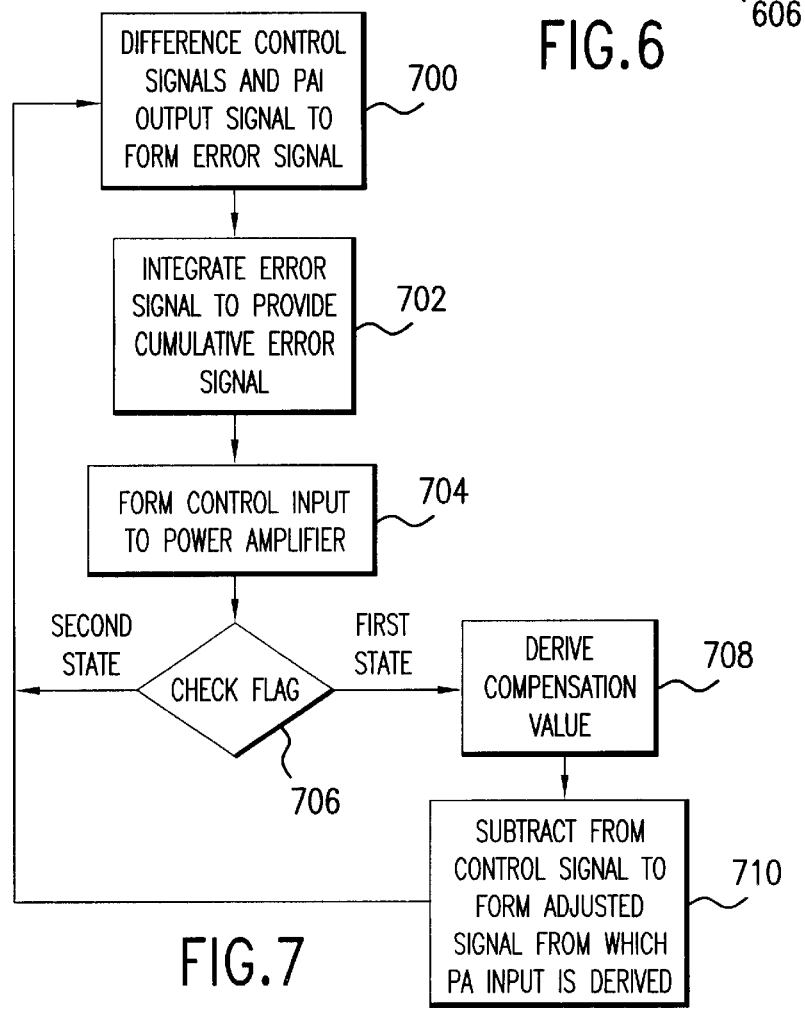
FIG. 7 is a flowchart illustrating a method of compensating for a saturation condition of a power amplifier.

FIG. 7 illustrates an embodiment of a method of saturation equalization or compensation. In step 700, a signal representative of or derived from a control signal for controlling the shape of a power amplifier and a signal representative of or derived from the actual output of the power amplifier are differenced to produce an error signal. In step 702, the error signal is integrated to produce a cumulative error signal. In step 704, the input to the power amplifier is derived from the cumulative error signal. In step 706, a flag indicative of whether a saturation condition is present is checked. If placed in a first state, indicating that a saturation condition is present, steps 708 and 710 are performed. In step 708, a compensation value is derived either from the instantaneous error signal produced in step 700 or the cumulative error signal produced in step 702. In one implementation, this step occurs by multiplying the instantaneous error from step 700 by a predetermined constant. In another implementation, this step occurs by multiplying the average error (equal to the cumulative error from step 702 divided by the duration of time over which the error was accumulated) by a predetermined constant. In step 710, the signal representative of or derived from the signal for controlling the shape of the PA output is manipulated responsive to the compensation value. In one implementation, this step occurs by subtracting the compensation value from the signal representative of or derived from the control signal. A jump is then made to step 700. The process then repeats itself.

Turning back to step 706, if the flag is placed in a second state indicating that a saturation condition is not present, a jump is made to step 700. The process then repeats itself. Alternatively, in one implementation, the compensation value computed in step 708 during a previous onset of a saturation condition is retrieved and subtracted from the signal representative of the saturation condition. Then, the jump is made to step 700 to repeat the process.

Figure 8:
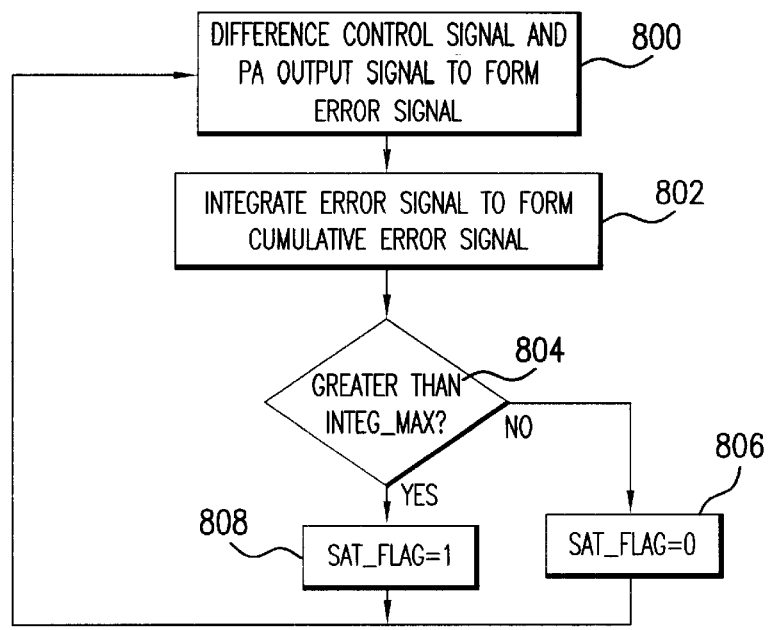
FIG. 8 is a flowchart illustrating a method of detecting for a saturation condition of a power amplifier.

An implementation of a method of detecting a saturation condition of a power amplifier is illustrated in FIG. 8. In step 800, a signal representative of or derived from a signal for controlling the shape of the PA output and a signal representative of or derived from the PA output are differenced to produce an error signal. In step 802, the error signal is integrated to produce a cumulative error signal. In step 804, the cumulative error is compared to a predetermined constant, INTEG_MAX, determined during device calibration. If the cumulative error exceeds INTEG_MAX, indicating that a saturation condition is present, step 808 is performed. Otherwise, step 806 is performed. In step 808, a flag, sat_flag, is set to 1, and then a jump is made to step 800. The process then repeats itself. In step 806, sat flag is reset to 0, followed by a jump to step 800. The process then repeats itself.

Figure 9:
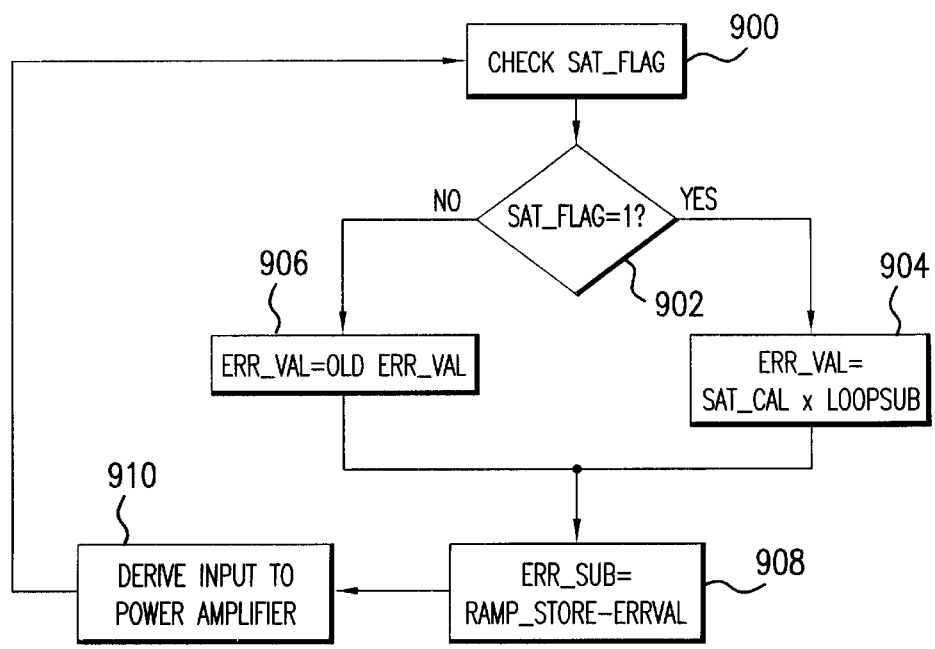
FIG. 9 is a flowchart illustrating a method of compensating for a saturation condition of a power amplifier.

An implementation of a method of equalizing or compensating for a saturation condition of a power amplifier is illustrated in FIG. 9. In step 900, a flag, sat_flag, is checked. In step 902, a determination is made whether sat_flag is set to 1 or reset to 0. If the flag is set to 1, indicating that a saturation condition is present, a jump is made to step 904. If the flag is reset to 0, indicating that a saturation condition is not present, a jump is made to step 906. In step 904, a value, err_val, is computed by multiplying the instantaneous loop error, loopsub, by a predetermined constant, SAT_CAL. In one implementation example, the loop error is computed by differencing a signal representative of or derivative of a signal for controlling the shape of the output of the PA and a signal representative of or derivative of the PA output. In this example, the value err_val, once computed, is latched. In step 906, the value of err_val latched during a previous onset of a saturation condition is retrieved. In step 908, the value err_val determined in one or the other of steps 904 and 906 is subtracted from ramp_store, a signal for controlling the shape of the output of the power amplifier. In step 910, the input to the power amplifier is derived from err_sub. In one implementation, this step occurs by integrating the loop error to produce a cumulative error signal, and then deriving the PA input from the cumulative error signal. A jump is then made to step 900, where the process repeats itself.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A system for detecting and compensating for a saturation condition in a power amplifier comprising:
   a power amplifier having an input and an output;
   a saturation compensation circuit for adjusting a control signal when a saturation condition is detected;
   a comparator for comparing a signal representative of or derived from the control signal with a signal representative of or derived from the output of the power amplifier and producing an error signal representing the difference between the two;
   an integrator for integrating the error signal to provide a cumulative error signal; and
   a saturation detector for detecting, responsive to the cumulative error signal, a saturation condition of the power amplifier where a signal derived from the adjusted control signal is input to the power amplifier.

2. The system of claim 1 wherein the comparator produces an error signal that is the difference between a signal representative of or derived from the adjusted control signal output from the saturation compensation circuit and the signal representative of or derived from the output of the power amplifier.

3. The system of claim 1 wherein the input to the power amplifier is derived from the output of the integrator.

4. The system of claim 1 wherein the saturation detector detects a saturation condition if the cumulative error signal exceeds a predetermined constant determined during device calibration.

5. The system of claim 1 wherein the detection of a saturation condition causes the saturation compensation circuit to derive a compensation value from the error signal and subtract the compensation value from the signal representative of or derived from the control signal.

6. The system of claim 5 wherein the saturation compensation circuit derives the compensation value from the instantaneous error provided from the comparator.

7. The system of claim 5 wherein the saturation compensation circuit derives the compensation value from the cumulative error provided by the integrator.

8. The system of claim 6 wherein the saturation compensation circuit derives the compensation value by multiplying the instantaneous error by a predetermined constant.

9. The system of claim 7 wherein the saturation compensation circuit derives the compensation value from the average error determined by dividing the cumulative error by the time period over which the error was accumulated.

10. The system of claim 9 wherein the saturation compensation circuit derives the compensation value by multiplying the average error by a predetermined constant.

11. The system of claim 1 in a communication device.

12. The communication device of claim 11 that is a GSM-compliant transmitter.

13. The communication device of claim 11 that is a mobile device.

14. The system of claim 1 further comprising circuitry for producing the control signal.

15. The system of claim 14 wherein the circuitry for producing the control signal is a ramp store.

16. The system of claim 14 wherein the control signal controls the shape of the output of the power amplifier.

17. A method for detecting a saturation condition of a power amplifier having an output, comprising the steps of:
   differencing a signal representative of or derived from a control signal and a signal representative of or derived from the output of the power amplifier to produce an error signal;
   integrating the error signal to produce a cumulative error signal; and
   detecting the saturation condition responsive to the cumulative error signal.

18. A method for detecting a saturation condition of a power amplifier having an output, comprising the steps of:
   differencing a signal representative of or derived from a control signal and a signal representative of or derived from the output of the power amplifier to produce an error signal;
   integrating the error signal to produce a cumulative error signal; and
   detecting the saturation condition if a cumulative error value derived from the cumulative error signal exceeds a predetermined constant determined during device calibration.

19. A method for detecting a saturation condition of a power amplifier having an output, comprising the steps of:
   differencing a signal representative of or derived from a control signal and a signal representative of or derived from the output of the power amplifier to produce an error signal;
   integrating the error signal to produce a cumulative error signal;
   detecting the saturation condition responsive to the cumulative error signal; and placing a flag in a first state if a saturation condition is detected, and otherwise placing the flag in a second state.

20. A method of compensating for a saturation condition of a power amplifier having an input and an output, comprising detecting a saturation condition responsive to cumulative error between a signal representative of or derived from a control signal and a signal representative of or derived from the output of the power amplifier, and performing the following steps upon, during or after detecting the saturation condition:
   differencing a signal representative of or derived from a control and a signal representative of or derived from the output of the power amplifier to form an error signal;
   deriving a compensation value from the error signal;
   adjusting the control signal responsive to the compensation value; and
   deriving the input to the power amplifier from the adjusted signal.

21. The method of claim 20 wherein the adjusting step comprises subtracting the compensation value from the signal representative of or derived from the control signal.

22. A method of compensating for a saturation condition of a power amplifier having an input and an output, comprising performing the following steps upon, during or after detecting a saturation condition:
  differencing a signal representative of or derived from a control signal and a signal representative of or derived from the output of the power amplifier to form an error signal;
  deriving a compensation value responsive to an instantaneous error value derived from the error signal;
  adjusting the control signal responsive to the compensation value; and
  deriving the input to the power amplifier from the adjusted signal.

23. The method of claim 22 wherein the first deriving step comprises deriving a compensation value by multiplying an instantaneous error value derived from the error signal by a predetermined constant.

24. The method of claim 20 further comprising integrating the error signal to provide a cumulative error signal.
  deriving the input to the power amplifier from the adjusted signal.

25. A method of compensating for a saturation condition of a power amplifier having an input and an output, comprising performing steps upon; during or after detecting a saturation condition:
  differencing a signal representative of or derived from a control signal and a signal representative of or derived from the output of the power amplifier to form an error signal;
  integrating the error signal to provide a cumulative error signal;
  deriving an average error value from the cumulative error signal, and deriving the compensation value by multiplying the average error value by a predetermined constant;
  adjusting the control signal responsive to the compensation value; and
  deriving the input to the power amplifier from the adjusted signal.

26. The method of claim 20 wherein the second deriving step comprises integrating the error signal to provide a cumulative error signal, and deriving the input to the power amplifier from the cumulative error signal.

27. The method of claim 20 further comprising latching the compensation value.

28. A method of compensating for a saturation condition of a power amplifier having an input and an output, comprising performing the following steps upon, during or after detecting a saturation condition:
  differencing a signal representative of or derived from a control signal and a signal representative of or derived from the output of the power amplifier to form an error signal;
  deriving a compensation value responsive to the error signal;
  adjusting the control signal responsive to the compensation value;
  deriving the input to the power amplifier from the adjusted signal;
  latching the compensation value; and
  retrieving the latched compensation value and adjusting the control signal responsive to the latched compensation value after the saturation condition has ceased.

29. The method of claim 20 comprising detecting the saturation condition by
  differencing a signal representative of or derived from a control signal and a signal representative of or derived from the output of the power amplifier to produce an error signal;
  integrating the error signal to produce a cumulative error signal; and
  detecting the saturation condition responsive to the cumulative error signal.

30. A system for detecting and compensating for a saturation condition in a power amplifier comprising:
  a power amplifier having an input and an output;
  saturation compensation means for adjusting a control signal when a saturation condition is detected;
  comparator means for comparing a signal representative of or derived from the control signal with a signal representative of or derived from the output of the power amplifier and producing an error signal representing the difference between the two;
  integrator means for integrating the error signal to provide a cumulative error signal; and
  saturation detection means for detecting, responsive to the cumulative error signal, a saturation condition of the power amplifier where a signal derived from the adjusted control signal is input to the power amplifier.

31. A method for detecting a saturation condition of a power amplifier having an output, comprising the steps of:
  a step for differencing a signal representative of or derived from a control signal and a signal representative of or derived from the output of the power amplifier to produce an error signal;
  a step for integrating the error signal to produce a cumulative error signal; and
  a step for detecting the saturation condition responsive to the cumulative error signal.

32. A method of compensating for a saturation condition of a power amplifier having an input and an output, comprising a step for detecting saturation condition responsive to cumulative error between a signal representative of or derived from a control signal and a signal representative of or derived from the output of the power amplifier, and performing the following steps upon, during or after detecting the saturation condition:
  a step for differencing a signal representative of or derived from a control signal and a signal representative of or derived from the output of the power amplifier to form an error signal;
  a step for deriving a compensation value from the error signal;
  a step for adjusting the control signal responsive to the compensation value; and
  a step for deriving the input to the power amplifier from the adjusted signal.

* * * * *

UNITED STATES PATENT AND TRADEMARK OFFICE
CERTIFICATE OF CORRECTION

PATENT NO. : 6,476,677 B1 Page 1 of 1
DATED : November 5, 2002
INVENTOR(S) : Jaleh Komaili and Ricke W. Clark It is certified that error appears in the above-identified patent and that said Letters Patent is hereby corrected as shown below:

Column 8,
Line 56, after "control", insert -- signal --.

Column 9,
Delete lines 23 & 24.
Line 26, after "upon", delete ";" and insert -- , --.

Signed and Sealed this

Fifth Day of October, 2004

JON W. DUDAS
*Director of the United States Patent and Trademark Office*